United States Patent [19]

Tanabe

[11] Patent Number: 4,849,785
[45] Date of Patent: Jul. 18, 1989

[54] IMAGE RECORDING APPARATUS
[75] Inventor: Kazunori Tanabe, Nagoya, Japan
[73] Assignee: Brother Kogyo Kabushiki Kaisha, Aichi, Japan
[21] Appl. No.: 167,129
[22] Filed: Mar. 11, 1988
[30] Foreign Application Priority Data Mar. 13, 1987 [JP] Japan .............................. 62-37590[U]

[51] Int. Cl.$^4$ ...................... G03G 15/00; G03G 15/16
[52] U.S. Cl. .................................... 355/202; 355/259; 355/298; 355/326; 355/211; 355/212
[58] Field of Search ........... 355/3 TR, 3 R, 1, 14 TR, 355/3 DD, 14 D

[56] References Cited
U.S. PATENT DOCUMENTS 4,657,373 4/1987 Winthaegen et al. ....... 355/3 TR X
4,674,857 6/1987 Satomura et al. ........... 355/3 TR X
4,688,925 8/1987 Randall ........................... 355/3 TR Primary Examiner—A. C. Prescott
Attorney, Agent, or Firm—Oliff & Berridge

[57] ABSTRACT

An image information is recorded first on the photosensitive drum in the form of opaque image which is the collected form of toner substances magnetically attracted to electrified photosensitive drum. This opaque image is then transferred on an intermediate film which is turned and exposed by an exposing means. At the same time, toner substances for forming an opaque image on the intermediate film are also recycled. This opaque image can be formed inside the inner periphery of a transparent image carrying member while it is being turned around and exposed by using a first exposing means. This opaque image is exposed again by a second exposing means to form a latent image on the photosensitive recording sheet tightly fit onto the transparent image carrying member, thus enabling the image to be formed clearly without diffusion.

19 Claims, 6 Drawing Sheets

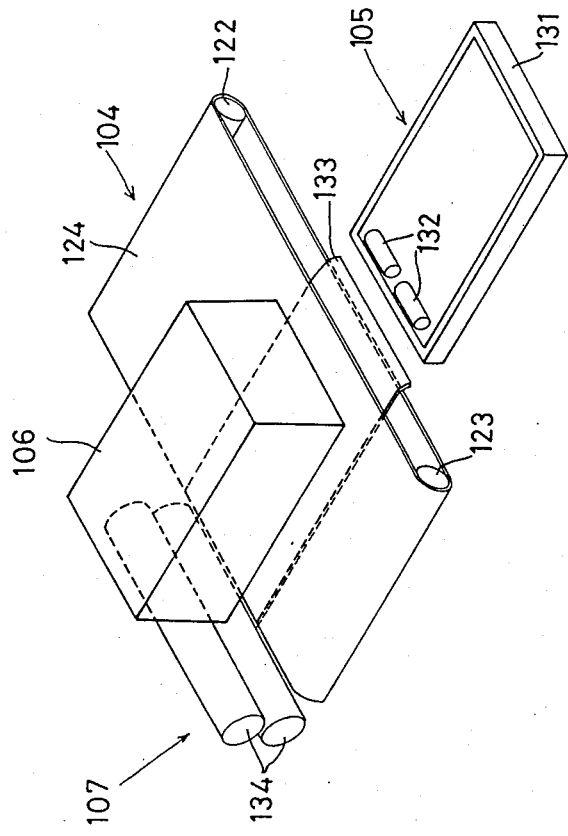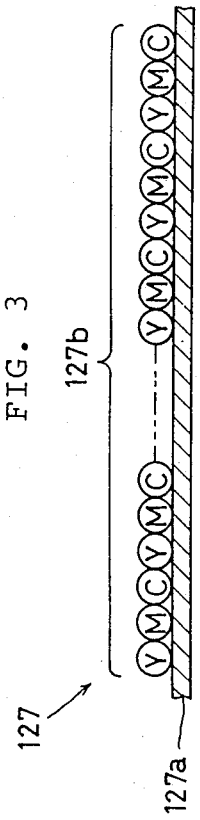

IMAGE RECORDING APPARATUS

BACKGROUND OF THE INVENTION

1. Field of the Invention

This invention relates to an image-recording apparatus in which a required image information is recorded on the photosensitive materials.

2. Description of the Prior Art

In a prior art, an image recording apparatus is provided with a laser scanner unit, a xerography unit, a photopermeable member transfer unit and an exposing apparatus.

Depending on predetermined image information, a laser beam emitted from a semiconductor laser incorporated in the laser scanner unit is transmitted via a polygonal mirror rotated by a motor, a $f\theta$ lens and a reflecting mirror to form an electrostatic latent image on a photosensitive drum of the xerography unit which is electrified wholly by an electrifier.

When the electrostatic latent image is formed on the photosensitive drum, the image is copied on a photopermeable member and transferred in synchrony with the revolution of turning of the photosensitive drum until the static latent image is located face to face with an exposing apparatus. At this time, diffused light is emitted from the exposing apparatus and passed through the developed opaque image on the photopermeable member. Then, a latent image is formed on a photo sensitive recording member and is developed by a second developing apparatus.

According to this conventional image-recording apparatus, the toner substances are recollected in a toner re-collector after transferring the latent image on the photopermeable member. Further, toner substances which are transferred on the photopermeable member in synchrony with the revolutions thereof are recollected also in a cleaning apparatus after they are illuminated by the exposing device and exposed to the photopermeable member.

In this manner, there are a total of three toner disposing apparatuses installed independently from each other: the toner case for housing toner substances in order to develop the static latent image formed on the photosensitive drum; the toner substances recollector to recollect the residual toner substances left on the photosensitive drum after transferring the opaque latent image on the photopermeable member; the cleaning apparatus for removing the opaque latent image on the photopermeable member therefrom after the photo sensitive recording member is exposed.

Due to independent installation of these apparatuses, the system results in a large scale of apparatus and complicated fabrication. Also, optimum conditions for the toner substances housed in their respective cases should be constantly and carefully maintained. Furthermore, although the toner substances can generally be recollected and used again, recycling of toner substances is unfeasible due to the inconvenient arrangement of the independently installed toner cases which can pose a whole system.

Therefore, the quantity of toner used per cycle is high as is the cost to copy one sheet image. To realize effective recycling of toner substances, a system was contrived in which the toner substances recollected both in the toner recollector and the cleaning apparatus are then recollected in the toner case.

However, this system was not successful in that it required a highly sophisticated system & excessively consumed electric power. The toner substances should be more effectively used so that they can be re-used by employing recycling system. The system should be simplified, and better engineered to allow recycled use of toner substances with reduced cost per one sheet of copy. Further, the quantity of toner substances used should be minimized and the amount recycled should be maximized.

In the image recording apparatus as described above, it is necessary to set an photopermeable image carrying member or intermediate member on which a opaque image is carried and transferred therewith. Therefore, the total size of apparatus is extended such that a required image corresponding to original image information can be satisfactorily photocopied, resulting in large scale and complicated construction. Also, the maintenance care after installation is tedious and troublesome. The prior art of this invention is disclosed in U.S. patent application Ser. Nos. 50,131 and 32,865 filed by the same applicant.

SUMMARY OF INVENTION

Therefore, it is the first object of the present invention to provide a simplified system in which the recollected toner substances can be re-used by using a simplified recollecting system, the total quantity of toner substances and the cost per sheet of copy is minimized.

It is the second object of the present invention to provide an apparatus in which a clear image can be formed on a photo-pressure sensitive recording sheet.

The above described and other objects can be attained by providing an image recording apparatus comprising;

latent image carrying member carrying a latent image on one surface thereof, a latent image forming means for forming said latent image on said surface of said latent image carrying member based on a predetermined image information, a first developing means for forming a opaque image, corresponding to said latent image on said latent image carrying member, on one surface of a photopermeable member, a photosensitive recording member disposed at a position adjacent to one of said latent image carrying member and said photopermeable member carrying said opaque image, an exposing means disposed at said opaque image side of said photopermeable member, illuminating said photo sensitive recording member via said photopermeable member and forming a latent image, corresponding to said opaque image, on said photosensitive recording member, a second developing means for developing the latent image on said photosensitive recording member, a cleaning means for removing said latent image and opaque image from said latent image carrying member and said photopermeable member; and a collecting means of said opaque image removed from said photopermeable member for reusing of said opaque image.

BRIEF DESCRIPTION OF THE DRAWINGS

FIG. 2 is a perspective view showing a transfer unit of a photopermeable member and a developing portion.

FIG. 3 is a partial sectional view showing a photopressure sensitive sheet exposed to light.

DETAILED DESCRIPTION

Figure 1:
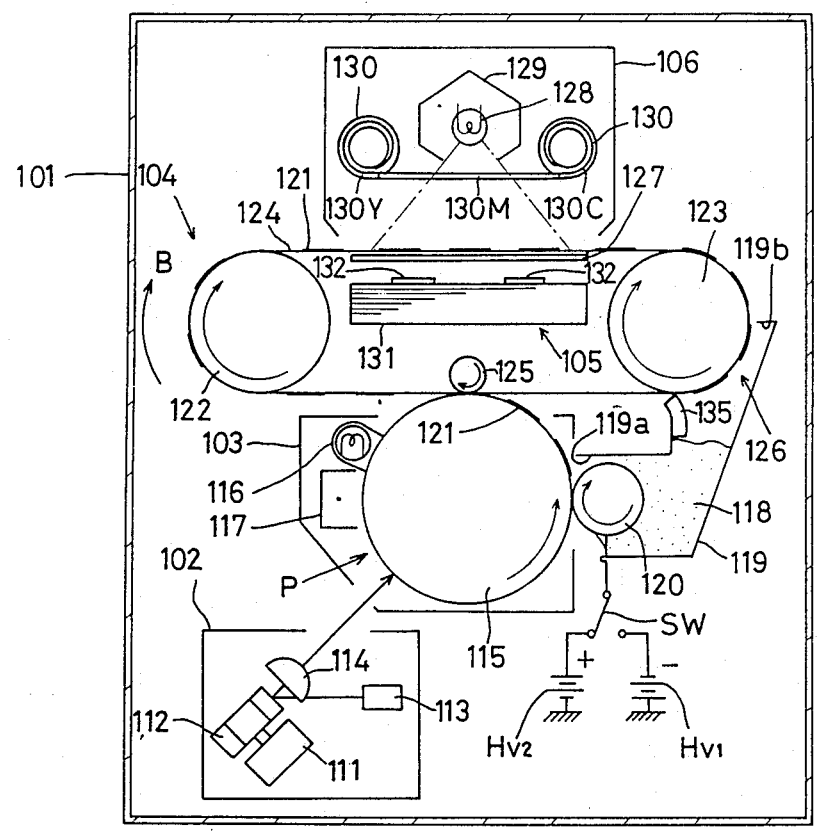
FIG. 1 is a sectional elevation view showing the first embodiment of the present invention.

Referring now to FIG. 1, there is provided in a color-image-recording apparatus body 101 of the present invention; a laser scanner unit 102, a xerography unit 103, a photopermeable member transferring unit 104, a photo-pressure sensitive sheet supply unit 105, an exposing unit 106 as an exposing portion and a pressure developing unit 107 as a developing portion. The laser scanner unit 102 disposed at a lower portion of the apparatus body 101 consists of a motor 111, a polygonal mirror 112 rotated by the motor 111, a semiconductor laser 113 for emitting a laser beam to a polygonal mirror 112 and a fθ lens 114. There is also a photosensitive drum 115 in the xerography unit 103 disposed on the upper part of the laser scanner unit 102. On an outer periphery of the photosensitive drum 115, a de-electrifier 116, a electrifier 117, an exposed area P which said laser scanner unit 102 illuminates and a toner housing case 119 for housing the toner substances 118 as an opaque substance is arranged around the axis of the photosensitive drum 115.

In the toner housing case 119, there are provided a pair of openings, 119a and 119b, which are opened respectively for the photosensitive drum 115 and a cleaning portion 126 of an opaque carrying member 124 hereafter described as a photopermeable member. In the opening 119a at the side of photosensitive drum 115 is provided a well-known magnet roller 120 for image forming. The magnet roller 120 is connected to a source of negative high voltage Hv1 and positive high voltage Hv2 via a change-over switch Sw and is thereby positively or negatively charged depending on an arbitrary selection of the respective voltage type.

In accordance with rotation of the photosensitive drum 115, the residual electric charge is removed from the photosensitive drum 115 by using the de-electrifier 116 and then the photosensitive drum 115 is electrified negatively by the electrifier 117. By the regulating operation of a CPU (Central Processing Unit, not shown) based on a predetermined image information, a laser beam pattern corresponding to the predetermined image information is emitted from the laser scanner unit 102 to the exposing area P on the photosensitive drum 115, thus neutralizing the electric charge within the illuminated portion and forming an electrostatic latent image corresponding to the image information on the photosensitive drum 115.

On the other hand, the toner substances 118 are particles which contain therein magnetized powder and are electrified negatively the same as the non-imaged portion of photosensitive drum 115. When the magnetic roller 120 is connected to a power supply source Hv1 and negatively electrified, a repulsive force is produced between the toner substances 118 and the magnet roller 120. However, this repulsive force is smaller than the magnetic force between the toner substances 118 and the magnet roller 120, thereby causing the toner substances 118 to adhere by magnetic force to the outer periphery of magnet roller 120.

Then, the toner substances 118 are transferred from the toner housing case 119 to the outer periphery of the photosensitive drum 115 in accordance with the rotation of the magnet roller 120 under conditions that the toner substances 118 adhere stuck by magnetic force to the periphery of the magnet roller 120.

During transfer onto the drum, the toner substances experience a repulsive force from the non-imaged portion of the photosensitive drum 115 and therefore adhere to the imaged portion only and not the non-imaged portion. This is reversing sticking phenomena by magnetic force occurred in forming an opaque image 121 on the photosensitive drum 115 corresponding to the electrostatic latent image.

The opaque image can be formed in a different process. In this process, it is necessary to form an illuminating portion on the overall magnetized photosensitive drum 115 corresponding to the non-imaged portion of image information. When this non-imaged portion is illuminated, it is electrically neutralized; removing electricity on the photosensitive drum 115 corresponds to the imaged portion only. Then, the toner substances 118 electrified in opposite polarity to the imaged portion are stuck by static electricity to the imaged portion of the photosensitive drum and thus the opaque image 121 is formed thereon.

The photopermeable member transferring unit 104 arranged in close proximity to the xerography unit 103 is provided with: a pair of roller 122 and 123; a photopermeable member 124 as an image-carrying member which is rotatably driven by rollers 122 and 123 in the direction shown by an arrow B in FIG. 1, made of photopermeable materials such as polyethylene telephtalate; transfer roller 125 disposed at an upper surface of photopermeable member 124 through which it contacts with photosensitive drum 115; and a cleaning portion 126 disposed in close proximity with the other roller 123. An electric field passing from the transfer roller 125 through the photopermeable member 124 to the photosensitive drum 115 is generated, thus providing an electrostatic attraction force which acts on the toner substance 118 which forms opaque image 121 on the photosensitive drum 115 so as to attract the toner substance 118 towards the photopermeable member 124, causing the opaque image 121 to be transferred on the photopermeable member 124.

In this preferred embodiment, the image-forming portion is constructed of the laser scanner unit 102, the xerography unit 103, the magnet roller 120 and the photocopying roller 125 in order to form the opaque image 121 on the photopermeable member 124. Moreover, the photosensitive drum 115 continues to rotate after transferring the opaque image 121 on the photopermeable member 124 and the portion where the opaque image 121 existed on photosensitive drum 115 moves into position opposite the magnet roller 120, a point at which magnetic roller 120 is positively magnetized via switch Sw operated to contact a positive electric power source Hv2.

Due to this energization, the toner substances which were not transferred onto the photopermeable member 124 and remain on the photosensitive drum 115 are removed by static electricity onto the magnet roller 120.

Next, the photosensitive drum 115 is again electrically charged by the electrifier 117 in preparation for the next image after any residual electricity is removed from the photosensitive drum 115 by the de-electrifier 116.

The exposing unit 106 comprises an exposing portion which forms a latent image on a photo-pressure sensitive recording sheet 127 corresponding to the opaque image 121 on the photopermeable member 124. This exposing unit 106 is composed of an exposing lamp 128, a photocollector 129 and an interference filter 130 allowing filtration of only light frequencies corresponding to cyan, magenta and yellow color. Referring to FIG. 2, the photo-pressure sensitive recording sheet supply unit 105 is disposed at one side of the photopermeable member 124. This supply unit 105 consists of a paper feed cassette 131 for housing the photo-pressure sensitive recording sheet 127 in cut-sheet form as a photosensitive recording member, paper feed rollers 132 for feeding photo-pressure sensitive recording sheet 127 from the paper feed cassette 131 to the photopermeable member 124 and a seat guide 133 for guiding the photo-pressure sensitive recording sheet 127 from the paper feed roller 132 under the upper runaway passage of the photopermeable member 124 to an exposing position beneath the exposing unit 106. The photopressure sensitive recording sheet is disclosed in U.S. Pat. No. 4,440,846.

In this preferred embodiment, the photo-pressure sensitive recording sheet 127 is, as disclosed in U.S. Pat. No. 4,440,846, a photo-pressure sensitive sheet for color picture printing. As shown in FIG. 3, this photo-pressure sensitive recording sheet 127 is formed by coating a paper-form member 127a with both microcapsules 127b which encapsulate chromogenic materials and photo-curable resins for producing a basic color of either cyan, magenta, or yellow and with the developing agents chemically reactive with the chromogenic materials. In the exposing unit 106, one basic color is selected arbitrarily through respective filters, 130 Y, 130 M, 130 C located within a limited area section of a light path zone, the light passes through the non-imaged portion on the photopermeable member 124.

The light thus passing through the photopermeable member 124 cures only these microcapsules 127b, coated on the photopressure sensitive recording sheet 127, corresponding to the non-imaged portion of the photopermeable member 124. Thus, a latent image is formed on the photo-pressure sensitive recording sheet 127 for colors corresponding to the image information entered. As a pressure-developing part, there is provided at the side opposite the side nearest the sheet supply unit 105 a pair of detachable pressure-developing rollers 134 into which the photo-pressure sensitive recording sheet 127 is fed as guided by the sheet guide 133 and pressed therebetween.

When the photo-pressure sensitive recording sheet 127 is pressed, the uncured microcapsules 127b locating at the latent image 121 on the photo-pressure sensitive recording sheet 127 are ruptured and the chromogenic materials contained therein effuse and chemically react with the developing agents, thus producing an image on the photopressure sensitive recording sheet 127.

As previously described, there is provided an opening 119b on the other side of the toner housing case 119 which opens toward the cleaning portion 126 of the photopermeable member 124. The opening 119b is provided with a cleaning blade 135 as a removing member. After the opaque image 121 is exposed to light and used as a mask on the photopermeable member 124, the image is deleted and the toner substances are removed from the photopermeable member 124 by the cleaning blade 135. After removal, the toner substances 118 are collected in the toner housing case 119.

In operation, the latent image is formed on the photopressure sensitive recording sheet 127 in the order of filtered cyan, magenta and yellow colors. First, when the photosensitive drum 115 is rotated counterclockwise as shown in FIG. 1, the photopermeable member 124 moves in the direction shown by arrow B. At the same time, the opaque image 121 corresponding to yellow color is formed on the photosensitive drum 115 coupled with the combined functions of the laser scanner unit 102, the xerography unit 103 and the magnet roller 120. The image 121 thus formed is transferred onto the photopermeable member 124 through the use of copying roller 125.

Next, the yellow color is selected to pass through the interference filter 130 when its yellow filtering portion 130Y is moved into place within a light beam. The yellow light passing through both the filtering portion 130Y and the opaque image 121 formed on the photopermeable member 124 illuminates photo-pressure sensitive recording sheet 127. The microcapsules 127b the photo-pressure sensitive recording sheet 127 on which are completely shielded from exposure to light by the latent image 121 are not cured while these microcapsules 127b unshielded by latent image 121 are exposed to yellow light and cured. Then, the latent image 121 corresponding to yellow is formed on the photo-pressure sensitive recording sheet 127.

After image forming on the photo-pressure sensitive recording sheet 127, the opaque image 121 formed on the photopermeable member 124 corresponding to yellow is removed by the cleaning blade 135 provided in the toner housing case 119 and collected therein. While the the latent image is being removed, the photo-pressure sensitive recording sheet 127 is held in one position in the exposing area of the exposing unit 106.

The image forming of other colors, cyan and magenta, is executed in the same manner as previously described. The opaque images 121 corresponding to cyan and magenta formed on the photosensitive drum 115 are transferred onto the photopermeable member 124 and set in the order of the image information entered. In so doing, cyan or magenta color is filtered when the respective filtering portions 130M and 130C are selectively and positioned within the light path in the exposing unit 106. When the filtered color illuminates the photo-pressure sensitive recording sheet 127, the latent images corresponding to the filtered color is formed thereon.

When all colors required are filtered and the latent image is formed, the photo-pressure sensitive recording sheet 127 rolled into the pressure-developing rollers 134 provided in the pressure-developing unit 107. At this time, the photo-uncured microcapsules 127b which were not exposed to light as masked out by the image 121 are ruptured. When ruptured, the chromogenic materials contained therein effuse and chemically react with the developing agents coated on the sheet 127, thus forming a color image on the photo-pressure sensitive recording sheet 127.

As so far described, the toner substances are transported to the photosensitive drum 115 through the opening 119a of toner housing case 119 provided at the side of photosensitive drum 115. When the magnetic roller 120 contacts photosensitive drum 115, the opaque image 121 is formed on the photosensitive drum 115 and then transferred on the photopermeable member 124. After the photo-pressure sensitive recording sheet 127 is exposed by the exposing unit 106 through the photopermeable member 124, the opaque image 121 formed on the photopermeable member 124 is removed and recollected by using the cleaning blade 135 provided on the opening 119b opening toward the cleaning part 126 of the photopermeable member 124.

For one transport cycle of toner substances from the image forming on the photosensitive drum 115 to the colored image forming on the photo-pressure sensitive recording sheet 127, only one toner housing case is needed in the apparatus 101 for housing the toner substances 118. Recycled use of toner substances is possible through highly efficient recollection into the toner housing case 119. At the same time, the apparatus can be designed smaller and simple.

Moreover, consumption of toner substance during a cycle of image recording can be reduced greatly, resulting in reduced cost per sheet of copy. The present invention is not restricted to only this preferred embodiment but can be applied to any other possible applications in the form of the most preferred embodiment within the spirit of the present invention. The present invention can be embodied for example in other preferred embodiments as follows;

(1) The laser scanner unit 102 in the preferred embodiment of the present invention can be replaced with the original-image-reading exposing unit.

(2) The laser scanner unit 102 and the xerography unit 103 in the preferred embodiment of the present invention can be replaced with a magnet graph unit or a thermo-magnet graph unit.

(3) A roll paper can be used in place of the photo-pressure sensitive recording sheet 127.

(4) The photo-pressure sensitive recording sheet 127 can be replaced with a so called separate type photo-pressure sensitive sheet in which only the microcapsules, encapsulating therein chromogenic materials for basic colors and photo-curing resins are coated on the transparent resin base plate, while the developing agents is coated on a separate copying sheet. This photo-pressure sensitive recording sheet is disclosed in U.S. Pat. No. 4,399,209.

(5) The photo-pressure sensitive recording sheet 127 can be replaced with a photo-pressure sensitive sheet which can be colored and pressurized when heat is applied.

(6) The microcapsules encapsulating chromogenic materials for three colors, cyan, magenta and yellow can be replaced with a photo-pressure sensitive sheet containing microcapsules which contain chromogenic materials for one color only, black or either one of the colors of cyan, magenta and yellow. Using this type of photo-pressure sensitive sheet, the apparatus according to the present invention can be used as a mono-color image-recording apparatus.

Figure 4:
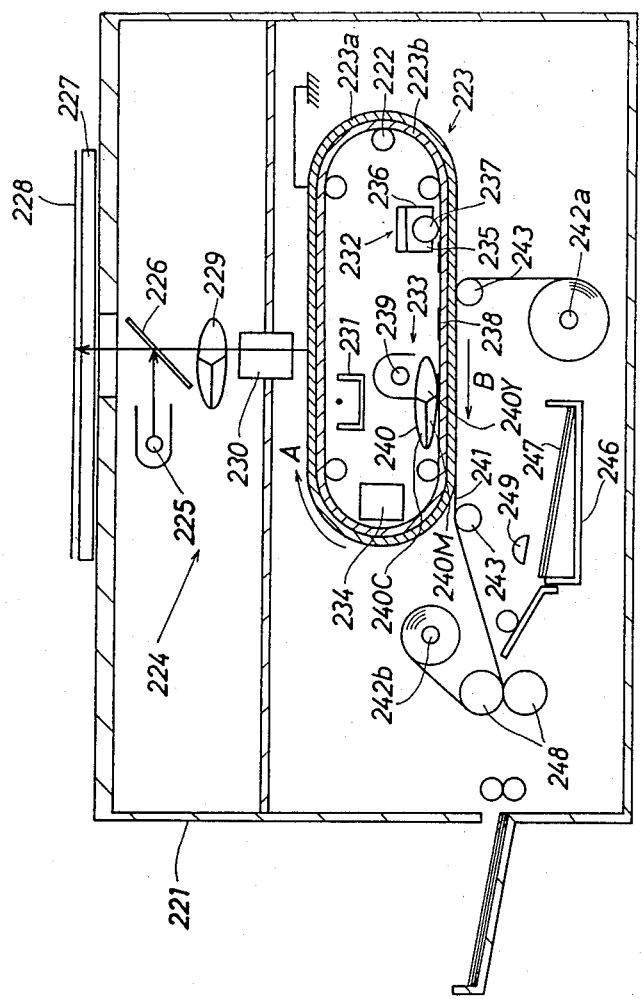
FIG. 4 is a sectional elevation view showing the second embodiment of the present invention.

Next, the second preferred embodiment of the present invention is explained with reference to FIGS. 4–6. As shown in FIG. 4, there is provided on a frame 221 with a photopermeable member 223 as a means for forming a latent image thereon which is guided by a plurality of guide rollers 222 and transferred circumferential driven by a drive means (not shown) in a direction shown by an arrow A. The photopermeable member 223 is formed by accumulating layers of a photopermeable photoconductive magnetized stage 223b inside a photopermeable magnetically conductive stage 223a which is grounded.

Moreover, over the photopermeable member 223 is arranged a latent image forming means 224 for forming a latent image. The diffused light emitted from a light source 225 is reflected by a half mirror 226 and illuminated onto an original 228 mounted on an original retaining glass 227 which can be driven horizontally by a drive means (not shown). The reflected light is then permeated through an interference filter 229 allowing a light only corresponding to a microwavelength respectively of cyan, magenta and yellow color after passing though the half mirror 226. The reflected light thus permeated reaches finally a lens array 230 and focuses an image corresponding to an original on the photopermeable magnetically conductive stage 223a of the photopermeable member 223.

In this manner, there formed an image on this magnetically conductive stage 223a as a result of focusing the image information corresponding to required colors only among colored lights which have been illuminated onto the original 228. After focusing, there extinguishes a electric charge corresponding to those focuses areas, thus forming a latent image 238 in accordance with the entered image information.

Inside the photopermeable member 223 is provided along circumferential direction thereof a magnetizer 231 for magnetizing uniformly the overall of the photopermeable member 223, a first developing means 232, a second exposing means 233 and a cleaning means 234 for removing toner substances 235 adhered to the inside of photopermeable member 223 and for removing residual electric charge impressed on the photopermeable member 223. There is also provided on the first developing apparatus 232 with a toner case 236 for housing black toner substances 235 which are electrified at the same polarity as that electrified on the non-imaged portions of the photopermeable member 223 and a developing sleeve 237. The toners 235 removed from the photopermeable member 235 are collected in the toner case 236 of the first developing apparatus 232 via a passage (not shown).

The toner substances 235 are not attracted to the non-imaged portions by a repulsive force of static electricity and attracted to the latent image only. Through this so called reversed developing process, there is formed a opaque image 238 corresponding to the latent image on the photopermeable member 223. Unlike this developing process, the developing can also be done by forming light-illuminating areas corresponding to non-imaged portions of image information on the surface of the photopermeable member 223 which is uniformly electrified and leaving electric charge on a portion corresponding to imaged portions of image information. In so doing, toner substances 235 are electrified oppositely to the imaged portions are absorbed by static electricity, thus forming a opaque latent image 238.

Further, there is provided in a second exposing means 233 with an exposing lamp 239 and an interference filter 240 for permeating only lights having microwavelength corresponding to cyan, magenta and yellow color. When a filter corresponding to a color required is selected among filters, 240C, 240M, 240Y and disposed on a light path, the light is permeated from the side where the latent image 238 is formed on the photopermeable member 223. A photo-pressure sensitive recording sheet 241 as a photo-pressure sensitive recording member is tied up between a pair of winding rollers 242a and 242b and guided by a guide roller 243. This photopressure sensitive recording sheet 241 is tightly fit unto the under surface of the photopermeable member 223 and further transferred with the photopermeable member 223 in a direction shown by an arrow B.

Figure 5:
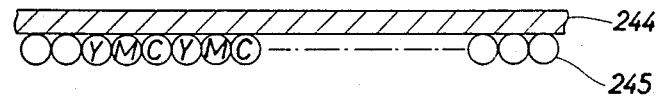
FIG. 5 is a partial sectional elevation view showing an enlarged portion of photo-pressure sensitive sheet.

As shown in FIG. 5, the photo-pressure sensitive recording sheet 241 is an equivalent of photoprinting sheet which carries microcapsules 245 on the reverse side of transparent base member 244 encapsulating chromogenic agents to be colored corresponding to basic colors of cyan, magenta and yellow and a photo-curing resin, separately from each other. When these microcapsules 245 are exposed by the second exposing means 233, only the microcapsules encapsulating colors corresponding to microwavelength of permeated light among microcapsules being exposed are cured, thus forming a latent image on the photo-pressure sensitive recording sheet 241. Moreover, on a paper supply cassette 246 disposed under the photo-pressure sensitive recording sheet 241 is an accumulated layer of transfer sheets 247 coating developing agents chemically reacted with the chromogenic agents encapsulated in microcapsules 245 to color.

Further, there is detachably mounted a pair of pressure fixing rollers 248 as a second developing means in the vicinity of the paper supply cassette 246. The transfer sheets 247 in the paper supply cassette 246 is supplied into a pair of press rollers 248 in one by one manner by the operation of a paper supply roller 249. Then, this transfer sheet 247 is overlapped with the photo-pressure sensitive recording sheet 241. Between a pair of these press rollers 248 comes an overlapped layer of the photo-pressure sensitive recording sheet 241 and the transfer sheet 247.

When microcapsules 245 are pressed by a pair of these press rollers 248, uncured microcapsules among microcapsules exposed to light are ruptured, thus effusing chromogenic agents encapsulated therein for chemically reacting with the developing agents coated on the transfer sheet 247. These effused chromogenic agents thus reacted with the developing agents results in forming an image on the trasfer sheet 247 as a result of a latent image on the photo-pressure sensitive recording sheet 241 being transferred into the press rollers 248.

According to the image recording apparatus of the second preferred embodiment of the present invention, first there is formed a opaque image 238 on the photopermeable member 223 directly on the inner periphery of the photopermeable member 223 and secondly there is formed a latent image when a light illuminates on the photo-pressure sensitive recording sheet 241 which is tightly fit onto the photopermeable member 223 to the reverse side. After forming a latent image on the photo-pressure sensitive recording sheet 241, respective latent image is developed. Accordingly, light emitted from the side of the opaque image 238 through the photopermeable member 223 is not diffused and illuminated on the photopressure sensitive recording sheet 241, thus enabling a clear latent image to be formed on the photo-pressure sensitive recording sheet 241.

As so far been explained in details, this apparatus uses the second exposing apparatus 233 which exposes the photopressure sensitive recording sheet 241 through the photopermeable member 223, thereby eliminating the need to produce an intermediate sheet.

Figure 7:
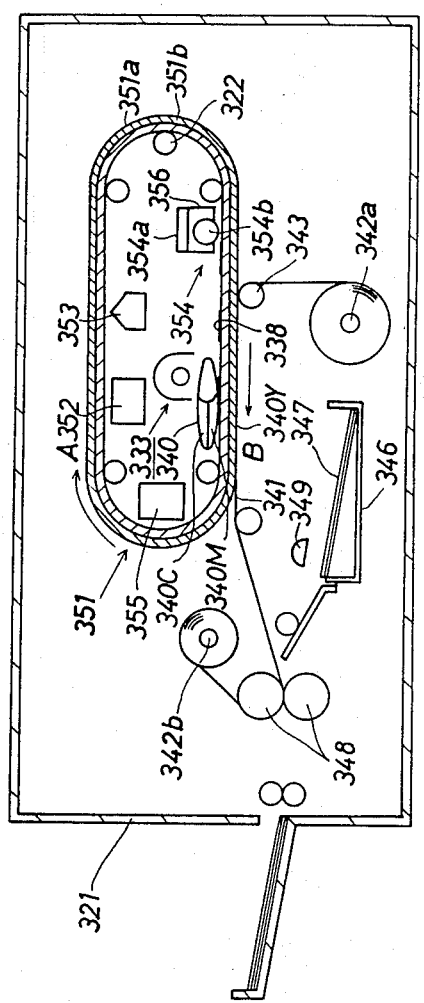
FIG. 7 is a sectional elevation view showing the third embodiment of the present invention.

Next, the third preferred embodiment of the present invention is explained with reference to FIG. 7 (The parts numbers are basically the same as the second preferred embodiment, except the first figure of 3-digit number which means the number of embodiments and other newly employed parts for this embodiment. The description on same parts is neglected). The construction of this preferred embodiment is approximately the same as the second preferred embodiment except a magnetic recording system (magnet graphy).

Then photopermeable member 351 employed in this preferred embodiment is formed by accumulating a photopermeable magnetic member 351b as a latent image carrying member on the surface of a photopermeable resin base 351b.

On the inner periphery of the photopermeable photo-sensitive member 351 are arranged in the transferring direction thereof a demagnetizer 352, a magnetic head 353 as a means for forming a latent image, a first developing means 354, an exposing means 333 and a cleaning means 355. In accordance with the peripheral transfer of the photopermeable member 351, the residual magnetic force is removed from the photopermeable magnetic member 351b by using the demagnetizer 352. Then, there is formed a magnetic latent image formed on the photopermeable magnetic member 351b by the magnetic head 353 which is operated depending on the image information entered.

There are also provided in the first developing means 354 a toner housing case 354a housing a black magnetic toner 356 as a opaque material and a developing sleeve 354b. As in the case of the second embodiment, the toners 356 are collected in the toner case 354a of the first developing apparatus 354 via a passage (not shown). The black magnetic toner housed in the toner housing case 354a is attracted to the magnetic latent image formed on the photopermeable magnetic member 351b by a magnetic force and a opaque image is formed on the photopermeable magnetic member 351b. Then, using an exposing means 333, a photo-pressure sensitive recording sheet 341 is exposed to a light through an opaque image 338 formed on the photopermeable magnetic member 351b, thus forming a latent image on the photo-pressure sensitive recording sheet 341 corresponding to the opaque image 338 on the photopermeable magnetic member 351b.

Figure 8:
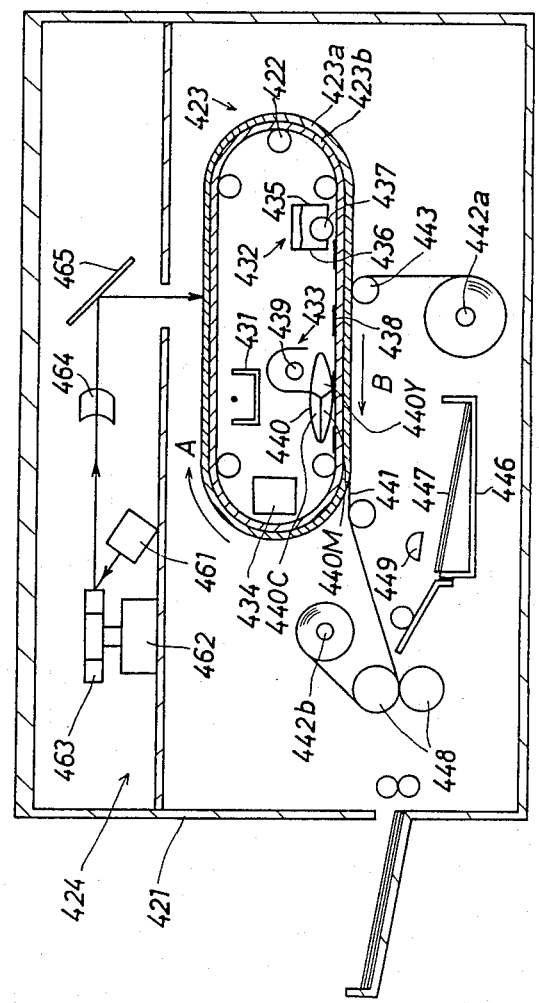
FIG. 8 is a sectional elevation showing the fourth embodiment of the present invention.

After latent image forming, the magnetic toner 356 magnetically attracted to the permeable magnetic member 351b is removed and recollected by the cleaning apparatus 355 in accordance with the peripheral transfer of the photopermeable member 351. Also in this preferred embodiment, the photopressure sensitive recording sheet 341 is tightly fit onto the photopermeable member 351 in the same manner as embodied in the second preferred embodiment of the present invention. Moreover, the present invention is not necessarily restricted to this preferred embodiment only but can be applied to any other best modes of preferred embodiments without deviating from the spirit and scope of the present invention such as for example;

(1) As a forth preferred embodiment of the present invention with reference to FIG. 8 (The parts numbers are basically the same as the second preferred embodiment, except the first figure of 3-digit number which means the number of embodiments and other newly employed parts for this embodiment. The description on same parts is neglected), the first exposing means 424 can be replaced by a laser scanner means. The apparatus constructed as shown in FIG. 8 is so constructed that a laser beam emitted from a semiconductive laser 461 is introduced to a photopermeable member 423 via a polygonal mirror 463, fθ lens 464 and a reflecting mirror 465 and finally a latent image is formed on the photopermeable member 423 corresponding to a required image information entered.

Figure 6:
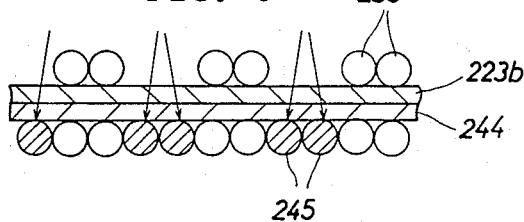
FIG. 6 is a vertical sectional elevation view showing an exposing in which a photosensitive member is closely fit onto a photo-pressure sensitive recording sheet.

(2) The photo-pressure sensitive recording sheet 241 of the second embodiment can be replaced by a photo-pressure sensitive sheet coating microcapsules encapsulating chromogenic agents corresponding to respective basic color and a photocuring resin in one unit with a developing agent all integrally on one photopermeable resin base 244 (FIG. 6).

(3) The photo-pressure sensitive recording sheet 241 of the second embodiment can be replaced by a photosensitive thermally fixing sheet which is colored and fixed under heat treatment.

(4) The photo-pressure sensitive recording sheet 241 can be replaced by a mono-color photo-pressure sensitive sheet which encapsulates only one color chromogenic agent among those corresponding to black or basic colors of cyan, magenta and yellow to allow functioning as a mono-color image recording apparatus.

(5) The magnetic image forming means of the third embodiment can be replaced by a thermally magnetic recording system wherein a transparent magnetic member overall magnetized is heated locally depending on a required image information entered and therefore magnetic force is deleted or reversed for forming a magnetic latent image.

(6) The photopermeable members 223, 351 can be replaced by an endless sheet which is rolled up at both ends thereof by winding rollers and can be turned around between both winding rollers. As in the case of the second embodiment, the toners 435 are collected in a toner case 436 of a first developing apparatus via a passage (not shown).

What is claimed is:

1. An image recording apparatus comprising:
a latent image carrying member carrying a latent image on one surface thereof;
a latent image forming means for forming said latent image on said surface of said latent image carrying member based on a predetermined image information;
a first developing means for forming a opaque image, corresponding to said latent image on said latent image carrying member, on one surface of a photopermeable member;
a photosensitive recording member disposed at a position adjacent to one of said latent image carrying member and said photopermeable member carrying said opaque image;
an exposing means disposed at said opaque image side of said photopermeable member, illuminating said photosensitive recording member via said photopermeable member to form a latent image, corresponding to said opaque image, on said photosensitive recording member;
a second developing means for developing the latent image on said photosensitive recording member;
a cleaning means for removing said latent image and opaque image from said latent image carrying member and said photopermeable member; and
a collecting means of said opaque image removed from said photopermeable member for reusing of said opaque image.

2. An image recording apparatus as claimed in claim 1, wherein said photopermeable member has a loop shape and is rotatable via rollers.

3. An image recording apparatus as claimed in claim 1, wherein said latent image carrying member has a cylindrical form.

4. An image recording apparatus as claimed in claim 1, wherein said latent image forming means comprises a semiconductive laser, polygonal mirror and a fθ lens.

5. An image recording apparatus as claimed in claim 1, wherein said first developing means comprises a transfer roller attaching to said latent image carrying member through said photopermeable member.

6. An image recording apparatus as claimed in claim 1, wherein said latent image carrying member is photopermeable and closely attached around the outer surface of said photopermeable member.

7. An image recording apparatus as claimed in claim 1, wherein said latent image forming means comprises a light source, a half mirror, a filter and a lens array.

8. An image recording apparatus as claimed in claim 1, wherein said first developing means comprises a toner, a toner case and a developing sleeve.

9. An image recording apparatus as claimed in claim 2, wherein said photosensitive recording member is disposed inside of said photopermeable member.

10. An image recording apparatus as claimed in claim 6, wherein said photosensitive recording member is disposed outside of said latent image carrying member.

11. An image recording apparatus as claimed in claim 1, wherein said exposing means comprises an exposing lamp and an interference filter.

12. An image recording apparatus as claimed in claim 1, wherein said second developing means comprises a pair of press rollers.

13. An image recording apparatus as claimed in claim 1, wherein said cleaning means includes a blade for scratching out said opaque image on said photopermeable member.

14. An image recording apparatus as claimed in claim 1, wherein said latent image carrying member is photopermeable and magnetic and said photopermeable member is made from resin.

15. An image recording apparatus as claimed in claim 1, wherein said cleaning means is a demagnetizer.

16. An image recording apparatus as claimed in claim 1, wherein said collecting means of said opaque image comprises a case for housing said opaque image, said case having two openings for receiving therein and discharging therefrom said opaque image for reusing thereof.

17. An image recording apparatus as claimed in claim 1, wherein a photopermeable sensitive recording member corresponds to said photopermeable member when said latent image carrying member is formed by said photopermeable member.

18. An image recording apparatus as defined in claim 1, wherein photosensitive recording member comprises a first recording medium carrying microcapsules which encapsulates therein a first coloring agent and change mechanical strength thereof by a given energy thereto and a second recording medium carrying a second recording medium carrying a second agent which changes color thereof by reacting with said first coloring agent.

19. An image recording apparatus as defined in claim 1, wherein said photosensitive recording member comprises a photosensitive recording member which carries microcapsules encapsulating therein a first coloring agent and changing mechanical strength thereof by a given energy thereto and carries a second agent which changes color thereof by reacting with said first coloring agent.

* * * * *